United States Patent
von Ammon

(10) Patent No.: US 7,868,325 B2
(45) Date of Patent: Jan. 11, 2011

(54) SEMICONDUCTOR WAFER OF SINGLE CRYSTALLINE SILICON AND PROCESS FOR ITS MANUFACTURE

(75) Inventor: Wilfried von Ammon, Hochburg (AT)

(73) Assignee: Siltronic AG, Munich (DE)

( * ) Notice: Subject to any disclaimer, the term of this patent is extended or adjusted under 35 U.S.C. 154(b) by 113 days.

(21) Appl. No.: 12/372,783

(22) Filed: Feb. 18, 2009

(65) Prior Publication Data

US 2009/0224366 A1  Sep. 10, 2009

Related U.S. Application Data

(60) Provisional application No. 61/035,056, filed on Mar. 10, 2008.

(30) Foreign Application Priority Data

Mar. 10, 2008  (DE) ................ 10 2008 013 325

(51) Int. Cl.
*H01L 29/04* (2006.01)
(52) U.S. Cl. ............... 257/56; 438/482; 257/E21.415
(58) Field of Classification Search ............ 257/52, 257/56, E21.193, E21.415; 438/482
See application file for complete search history.

(56) References Cited

U.S. PATENT DOCUMENTS

| 5,089,082 A | 2/1992 | Dreier et al. |
| 5,582,640 A * | 12/1996 | Okada et al. .......... 117/8 |
| 2003/0008479 A1 | 1/2003 | Chen et al. |

FOREIGN PATENT DOCUMENTS

| DE | 32 32 259 A1 | 1/1984 |
| JP | 52138072 A | 11/1977 |

* cited by examiner

*Primary Examiner*—Quoc D Hoang
(74) *Attorney, Agent, or Firm*—Brooks Kushman P.C.

(57) ABSTRACT

Semiconductor wafer of monocrystalline silicon contain fluorine, the fluorine concentration being $1 \cdot 10^{10}$ to $1 \cdot 10^{16}$ atoms/cm$^3$, and is free of agglomerated intrinsic point defects whose diameter is greater than or equal to a critical diameter. The semiconductor wafers are produced by providing a melt of silicon which is doped with fluorine, and crystallizing the melt to form a single crystal which contains fluorine within the range of $1 \cdot 10^{10}$ to $1 \cdot 10^{16}$ atoms/cm$^3$, at a growth rate at which agglomerated intrinsic point defects having a critical diameter or larger would arise if fluorine were not present or present in too small an amount, and separating semiconductor wafers from the single crystal.

22 Claims, 2 Drawing Sheets

SEMICONDUCTOR WAFER OF SINGLE CRYSTALLINE SILICON AND PROCESS FOR ITS MANUFACTURE

CROSS-REFERENCE TO RELATED APPLICATIONS

This application claims the benefit of U.S. provisional application Ser. No. 61/035,056, filed Mar. 10, 2008, and claims priority to German application 10 2008 013325.6 filed Mar. 10, 2008, both of which are herein incorporated by reference.

BACKGROUND OF THE INVENTION

1. Field of the Invention

The invention relates to a semiconductor wafer composed of silicon, which contains fluorine and is particularly suitable for producing electronic components because it has no agglomerated intrinsic point defects rated as disturbing. The invention also relates to a method for producing such a semiconductor wafer.

2. Background Art

Since the beginnings of microelectronics the manufacturers of semiconductor wafers composed of silicon have devoted themselves particularly to the task of eliminating defects rated as disturbing, at least in that region of the semiconductor wafer in which the construction of structures of electronic components is provided. Defects attributable to intrinsic point defects (silicon interstitials and vacancies) are generally rated as disturbing when their largest spatial extent in one direction is comparable to the extent of the smallest component structures or larger. Defects of agglomerated silicon interstitials which are surrounded by a network of dislocation loops and which have an extent in the micrometer range are referred to as A defects or Lpit defects ("large etch pit defects"). These defects are normally not acceptable at all. Defects which are formed by agglomerated vacancies and can be detected, for example as COP defects ("crystal originated particles") by means of infrared laser scattered light tomography, are tolerated only as long as they are smaller than the smallest component structures.

According to Voronkov's theory, the validity of which is supported by experimental results, the concentration of point defects in the single crystal is essentially determined by the ratio V/G during crystallization of the melt, where V denotes the rate of the crystallization and G denotes the axial temperature gradient at the boundary between the melt and the growing single crystal. According to the theory, there is a specific ratio V/G at which the concentrations of silicon interstitials and vacancies are identical. Below this ratio, interstitials are present in excess, and above the ratio, vacancies are present in excess. If a dominant type of point defect attains supersaturation during cooling, agglomerates of this type of point defect can arise. Agglomerates of vacancies ("voids") become increasingly larger, the longer the duration during cooling within the range of formation temperature of agglomerates. One strategy for avoiding disturbing vacancy agglomerates therefore consists in providing for the shortest possible residence time in the range of the formation temperature, which is around 1100° C., during cooling. However, single crystals having diameters of 200 mm or greater cannot be cooled arbitrarily rapidly, with the result that limits are imposed on controlling the size of defects by limiting the residence duration in the case of such single crystals. Another strategy pursues the aim of controlling the V/G ratio as far as possible such that a significant excess of one type of point defect does not actually arise in the first place. Such control is very complex in terms of process technology and not very economical because a comparatively low rate V has to be employed in this case. The process window available, that is to say the range of values within which the ratio V/G must be controlled, is narrowly delimited, moreover. For a predetermined G, the pulling rate V is normally permitted to vary only by ±0.01 mm/min. This latter requirement generally has the effect that parts of the single crystal cannot be utilized because they have defects that cannot be tolerated.

US2003/0008479 A1 describes a method for producing single crystals composed of silicon according to the Czochralski method, in which the presence of a "halogen getter" in the melt leads to a purifying of the melt, which brings about an attenuation of metal-induced defects, COP defects and other defects. In the preferred configuration, the melt contains at least 0.01% by weight or at least $4 \cdot 10^{18}$ atoms/cm$^3$ of the "halogen getter".

SUMMARY OF THE INVENTION

It is an object of the present invention to avoid defects rated as disturbing of agglomerated intrinsic point defects in semiconductor wafers composed of silicon in a reliable and simple manner, and to open up particularly economic access to such semiconductor wafers. These and other objects are surprisingly achieved by growth of MONOCRYSTALLINE silicon ingots from a fluorine-doped melt, producing a crystal having a fluorine content of from $1 \cdot 10^{10}$ to $1 \cdot 10^{16}$ atoms/cm$^3$.

DETAILED DESCRIPTION OF THE PREFERRED EMBODIMENTS

Figure 1:
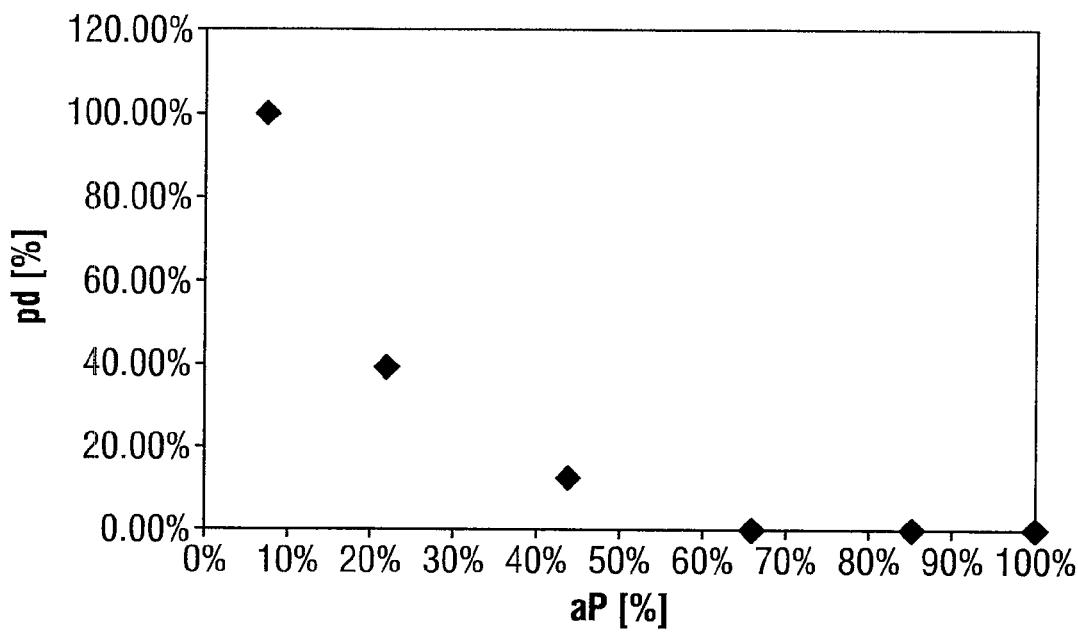
FIG. 1 illustrates the axial distribution of COP defects in single crystal silicon grown by the FZ method with an without doping by fluorine.

The invention thus relates to a semiconductor wafer composed of monocrystalline silicon, which contains fluorine, the fluorine concentration being $1 \cdot 10^{10}$ to $1 \cdot 10^{16}$ atoms/cm$^3$, and which is free of agglomerated intrinsic point defects whose diameter is greater than or equal to a critical, or "target" diameter.

The invention furthermore relates to a method for producing semiconductor wafers composed of monocrystalline silicon, comprising providing a melt composed of silicon which is doped with fluorine, and crystallizing the melt to form a single crystal which contains fluorine within the range of $1 \cdot 10^{10}$ to $1 \cdot 10^{16}$ atoms/cm$^3$, at a rate at which agglomerated intrinsic point defects having a critical diameter or a larger diameter would arise if fluorine as dopant were dispensed with, and separating semiconductor wafers from the single crystal.

The invention moreover relates to a method for producing semiconductor wafers composed of monocrystalline silicon, comprising providing a melt composed of silicon which is doped with a minimum concentration of fluorine or more than this minimum concentration, and crystallizing the melt to form a single crystal which contains fluorine within the range of $1\cdot10^{10}$ to $1\cdot10^{16}$ atoms/cm$^3$, at a specific rate which in the single crystal, in the absence of fluorine in the melt, would lead to the formation of agglomerated intrinsic point defects having a critical diameter or greater, and separating semiconductor wafers from the single crystal, the minimum concentration of fluorine being determined in a test experiment in which a test crystal is produced from a melt with a fluorine concentration that is continuously increased at least occasionally, and under otherwise identical conditions, and that fluorine concentration which, when reached, indicates that agglomerated intrinsic point defects whose diameter is greater than or equal to the critical diameter disappear in the test crystal is identified as the minimum concentration.

The invention is based on the discovery that fluorine interacts with intrinsic point defects with the result that the latter are no longer available for forming agglomerates. In relation to an excess of vacancies, this means that the formation of vacancy agglomerates no longer depends crucially on the concentration of the free vacancies incorporated, but rather on the concentration of the free vacancies that are not already bound to fluorine. According to the invention, the concentration of free vacancies is controlled by means of the concentration of fluorine which is taken up into the single crystal and thus into the semiconductor wafer that subsequently is produced therefrom. The concentration of free vacancies is reduced to an extent such that it no longer suffices to be able to form agglomerated vacancies whose diameter is greater than or equal to a diameter rated as critical.

In order to obtain the desired effect of fluorine, the fluorine concentration in the single crystal should be at least $1\cdot10^{10}$ atoms/cm$^3$, preferably at least $1\cdot10^{10}$ atoms/cm$^3$ and most preferably at least $1\cdot10^{12}$ atoms/cm$^3$. The upper limit of the fluorine concentration in the single crystal, for various reasons, should not be higher than approximately $1*10^{16}$ atoms/cm$^3$, preferably not higher than $1\cdot10^{15}$ atoms/cm$^3$ and most preferably not higher than $1\cdot10^{14}$ atoms/cm$^3$.

Fluorine concentrations such as are necessary for purifying the melt entail considerable process-technological difficulties during the crystallization, because volatile SiF$_4$ deposits on hot surfaces and decomposes to form layers of amorphous silicon. This affects particularly the surfaces of the growing single crystal and of the hot graphite parts of the crystallization device. If these amorphous layers become too thick, thermal stresses and ultimately material chippings occur on account of temperature differences. Chipped-off particles that fall into the melt generally cause dislocations in the growing single crystal. Moreover, excessively high fluorine concentrations in the single crystal involve the risk that fluorine atoms will also precipitate during the cooling phase of the single crystal to form larger aggregates, which then for their part form undesirable defect centers. This is the case when the aggregates become so large that, in a manner comparable to that in the case of Lpit defects, they bring about dislocation loops or networks of such dislocation loops in the single crystal. Despite this, such aggregates should perfectly well be regarded as advantageous as long as they are small enough to be able to be broken down by a thermal treatment of the semiconductor wafer at least in the region of a zone near the surface. After the thermal treatment, a defect-free zone ("denuded zone") then forms which reaches from the surface to preferably at least 10 µm into the bulk of the semiconductor wafer and is best suited to the implementation of component structures, while in the bulk of the semiconductor wafer there remains a zone having the aggregates as defect centers which bind metallic impurities as an internal getter. A prerequisite for this advantageous effect is that the fluorine concentration in the single crystal is so low that larger aggregates cannot form and the arising of a "denuded zone" is ensured. The thermal treatment is preferably effected at a temperature within the range of 550° C. to 1100° C., more preferably within the range of 600° C. to 1000° C.

The presence of nitrogen promotes the formation of seeds from which oxygen precipitates, so-called BMD ("bulk micro defects"), arise. Since they likewise act as a "getter", it is advantageous to additionally dope the melt with nitrogen, particularly when, owing to the presence of fluorine, the concentration of free vacancies is so low that BMD formation becomes inadequate, which occurs approximately when fewer than $1\cdot10^8$ BMD/cm$^3$ can be produced in the bulk of the semiconductor wafer. A nitrogen concentration in the semiconductor wafer of $1\cdot10^{13}$ to $5\cdot10^{14}$ atoms/cm$^3$ is particularly preferred.

In accordance with one configuration of the invention, the melt is doped with fluorine and hydrogen and, if appropriate, with nitrogen in order in addition, in particular in the presence of high oxygen concentrations of more than $5*10^{17}$ atoms/cm$^3$, to suppress the formation of oxidation induced stacking faults (OSF). Moreover, the melt is preferably also doped with at least one electrically active element, for example with boron, phosphorus, arsenic or antimony.

The invention can be advantageously used irrespective of whether the melt is crystallized according to the Czochralski method (CZ method) or according to the floating zone method (FZ method). In the case of the latter, the BMD formation can also be supported by targeted feeding of oxygen. One method suitable for this is described for example in U.S. Pat. No. 5,089,082. Irrespective of the production method, the semiconductor wafers separated from the single crystal can also be coated, for example with an epitaxial layer.

The doping of the melt with fluorine preferably takes place via the gas phase, that is to say by mass transfer from the atmosphere surrounding the melt, a gaseous fluorine source being fed to said atmosphere, into the melt. The fluorine concentration in the single crystal is preferably controlled by way of the partial pressure of the gaseous fluorine source in the atmosphere. In principle, the gaseous fluorine source can also be conducted directly into the melt. Moreover, a fluorine-containing solid can also be used as the fluorine source, this solid being melted together with silicon in order to provide the melt.

By way of example, SiF$_4$, HF, F$_2$, BF$_3$, PF$_5$ and mixtures of these compounds are suitable as the gaseous fluorine source. SiF$_4$ and F$_2$ are particularly preferred because through them only fluorine as impurity substance passes into the melt. HF is appropriate as dopant particularly in order that the melt is additionally also doped with hydrogen. Solids which are suitable as the fluorine source are, for example, NH$_4$F, (NH$_4$)HF$_2$, (NH$_4$)$_2$SiF$_6$ and (NH$_4$)BF$_4$.

The primary aim of the invention is not to permit formation of any agglomerates of intrinsic point defects whose diameter is greater than or equal to a critical diameter. The diameter of the agglomerates is taken to mean their longest extent in one spatial direction. In the case of agglomerated silicon interstitials, the critical diameter is at least the diameter at which the formation of Lpit defects must be mentioned. Consequently, the fluorine concentration in the single crystal is at any rate set such that no Lpit defects can be detected on the semiconductor wafer produced. A more stringent stipulation defines the critical diameter in the case of agglomerated silicon interstitials as the diameter at which so-called B defects are present. The fluorine concentration in the single crystal will then consequently have to be higher and is set such that no B defects can be detected on the semiconductor wafer produced. In the case of agglomerated vacancies, the critical diameter is the diameter which is rated as too large in accordance with a stipulation. The stipulation depends on the intended use of the semiconductor wafer, that is to say primarily on the widths of the smallest component structures for which the semiconductor wafer is intended to form the substrate. The critical diameter is, for example, 60 to 40 nm or 40 to 20 nm or, in the case of a particularly stringent stipulation, 20 to 5 nm. The fluorine concentration in the single crystal is then consequently set such that no defects of agglomerated vacancies having diameters in the predetermined range can be detected on the semiconductor wafer produced.

The particular economic benefit of the invention consists in the fact that the excess of vacancies that arises during rapid crystallization of the melt no longer has a limiting effect. Despite the vacancy excess that arises, the single crystals can be pulled as rapidly as is possible according to the process technology. The high vacancy excess that is then inevitably established is reduced by a corresponding amount of fluorine to an extent such that the remaining concentration of free vacancies no longer suffices to be able to form agglomerates whose diameter is rated as critical. In addition to the higher pulling rate possible, primarily the considerably larger process window, is of particular economic importance, which, for a given gradient G, makes available a wider range of pulling rates within which the single crystal that is produced has exclusively the specified defects.

The practical implementation is expediently effected by determining in a test what amount of fluorine source is at least necessary in order that, under chosen production conditions, agglomerates rated as too large precisely do not arise any longer. Thus, by way of example, a single crystal composed of silicon is pulled according to the Czochralski method with a comparatively high rate V and a quotient V/G which causes a high excess of vacancies to arise. While the single crystal is growing, a fluorine source is fed to the atmosphere surrounding it and the partial pressure of said fluorine source is continuously increased. The single crystal or semiconductor wafers cut from it are subsequently analyzed with regard to vacancy agglomerates present. By way of example, if a slab is cut axially from the single crystal and the cut surfaces are analyzed, vacancy agglomerates will be found whose size depends on the axial position in the slab. Since the axial position is linked to a specific partial pressure of the fluorine source, it can be decided straightforwardly what partial pressure is at least necessary in order to be able to pull, under otherwise identical conditions to those in the test, a single crystal which contains no COP defects rated as too large.

In principle, the test can also be effected such that a single crystal is pulled in an atmosphere with a specific proportion of a fluorine source and the quotient V/G is increased by continuously increasing the rate V. The analysis of the single crystal or of its semiconductor wafers will then reveal the rate which must not be exceeded under the chosen conditions in order that no vacancy agglomerates rated as too large arise.

The invention is demonstrated below using two examples.

EXAMPLE 1

A single-crystal rod composed of silicon was pulled in accordance with the FZ method, to be precise, firstly in an atmosphere comprising argon. The melt was doped neither with nitrogen nor with hydrogen. After a pulled rod length of 10 cm having a nominal diameter, $SiF_4$ as fluorine source was conducted into the atmosphere and the concentration was increased continuously from 0.6 l/h to 5 l/h up to a pulled rod length of 50 cm. Another 10 cm of rod length were then pulled without supply of $SiF_4$ and with a stationary gas atmosphere.

The entire single crystal remained free of dislocations. The subsequent analysis with regard to Lpit defects after Secco etch by visual inspection and with regard to COP defects by infrared laser scattered light tomography using an analysis device of the MO-4 type from the manufacturer Mitsui Mining and Smelting, Japan, revealed that the Lpit defects initially present in the edge region of the single crystal disappeared first and the COP defects present in the center region were no longer detectable starting from a rod length of 40 cm. Their size had accordingly fallen below the detection limit of the analysis device of approximately 20 nm. Even after the supply of $SiF_4$ had been ended, larger agglomerates no longer arose, evidently because due to the stationary gas atmosphere a sufficient fluorine partial pressure and thus a sufficient fluorine concentration were maintained in the melt, which continued to suppress the generation of larger point defect agglomerates.

The various crystal positions which were analyzed with regard to their defect density were subsequently measured with IR absorption. In this case, an absorption line whose intensity was correlated with the fluorine concentration was found at 1206 cm$^{-1}$. Fluorine can thereby be detected in the bulk by means of a simple measuring method.

Figure 2:
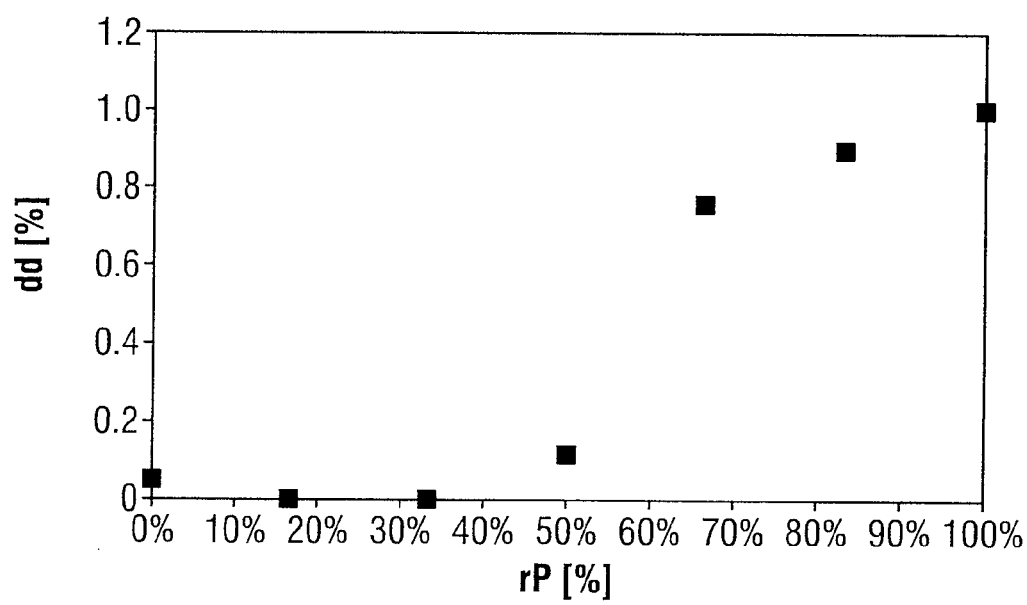
FIG. 2 illustrates the radial defect distribution of COP and Lpit defects in the crystal of FIG. 1.
Figure 3:
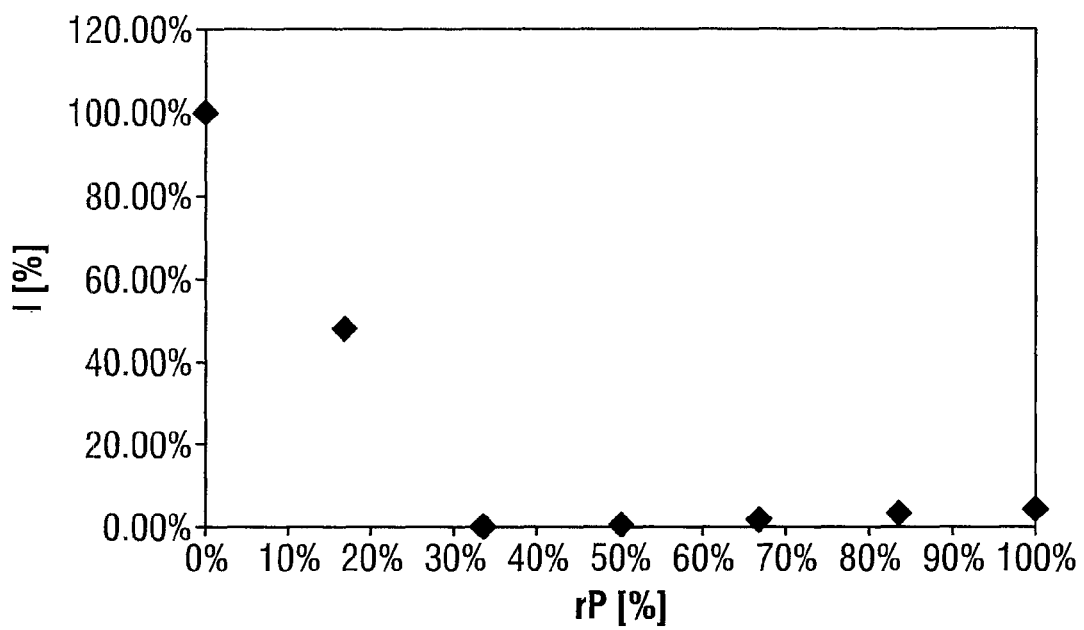
FIG. 3 is a plot of associated scattered light intensities per defect in the crystal of FIG. 1.
Figure 4:
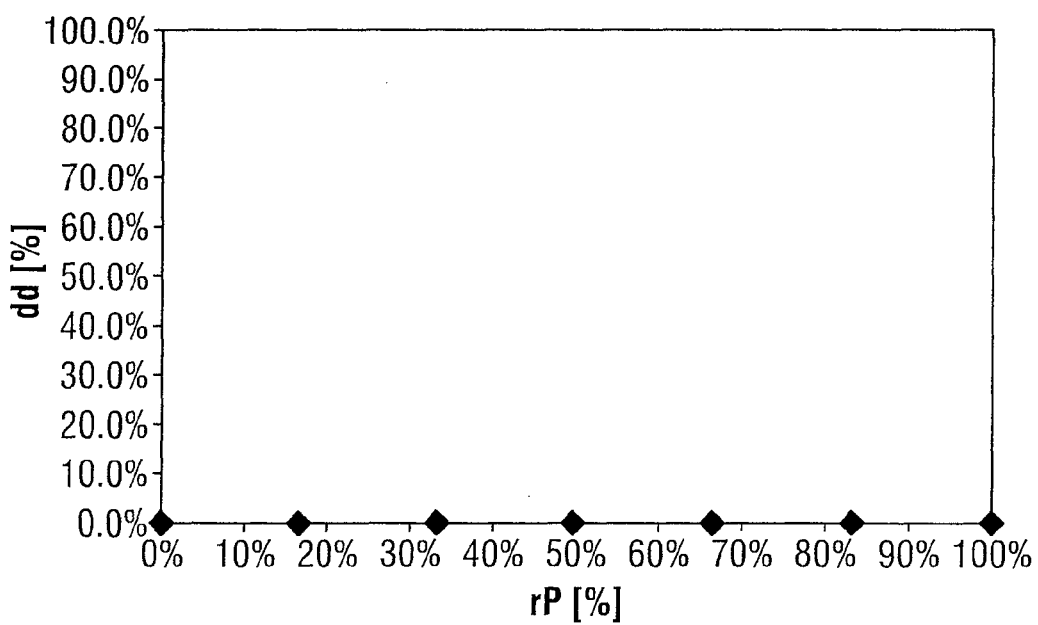
FIG. 4 illustrates the radial defect distribution of COP and Lpit defects in the crystal of FIG. 1.

The results of the investigations are illustrated in FIGS. 1 to 3. FIG. 1 shows the COP defects found as a function of the axial position in the single crystal. The peak density (pd) of the COP defects found is plotted against the axial position in the single crystal, aP, the pairs of values in each case being relative to 100%. A great decrease in the COP densities can be observed as the length of the single crystal increases. FIGS. 2 and 4 show by way of example how the radial defect distribution also changes with regard to the COP defects and Lpit defects. FIG. 2 shows the defect densities dd of COP defects and Lpit defects as a function of the radial position, rP, on the semiconductor wafer at the axial position aP=7.35% in the single crystal, the pairs of values likewise in each case being relative to 100%. The center of the semiconductor wafer is situated at rP=100%, and the edge is situated at rP=0%. FIG. 3 plots the associated intensities of the scattered light signals per defect, which are significantly higher in the case of Lpit defects, owing to their size, than in the case of COP defects and can therefore be used for distinguishing the two types of defect. In joint consideration, FIGS. 2 and 3 accordingly indicate Lpit defects in the edge region and COP defects in the center region of the semiconductor wafer. FIG. 4 is an illustration corresponding to FIG. 2 for the axial position aP=66.18% in the single crystal. At aP=66.18%, the COP defects in the center and Lpit defects at the edge that had still been detected previously at aP=7.35% have disappeared.

EXAMPLE 2

A single crystal composed of silicon having a length of 1 m and a diameter of 300 mm was pulled in accordance with the CZ method. Initially only argon was conducted through the pulling device. The melt was doped neither with nitrogen nor with hydrogen. After a pulled rod length of 20 cm having a nominal diameter was reached, $SiF_4$ as fluorine source was conducted in addition to argon through the pulling device and the $SiF_4$ flow rate was increased continuously from 30 l/h to 300 l/h. In this experiment, too, the increase in the fluorine concentration in the single crystal brought about the suppression of Lpit defects and COP defects initially present.

While embodiments of the invention have been illustrated and described, it is not intended that these embodiments illustrate and describe all possible forms of the invention. Rather, the words used in the specification are words of description rather than limitation, and it is understood that various changes may be made without departing from the spirit and scope of the invention.

What is claimed is:

1. A semiconductor wafer comprising monocrystalline silicon which contains fluorine, the fluorine concentration being $1\cdot 10^{10}$ to $1\cdot 10^{16}$ atoms/cm$^3$, and which is free of agglomerated intrinsic point defects whose diameter is greater than or equal to a target diameter wherein the target diameter lies within the range of 5 to 60 nm.

2. The semiconductor wafer of claim 1, wherein the fluorine concentration is $1\cdot 10^{11}$ to $1\cdot 10^{15}$ atoms/cm$^3$.

3. The semiconductor wafer of claim 1, wherein the target diameter lies within the range of 5 to 40 nm.

4. The semiconductor wafer of claim 1, wherein the wafer further comprises doping with nitrogen, hydrogen, or nitrogen and hydrogen.

5. The semiconductor wafer of claim 1, wherein at least one of boron, phosphorus, arsenic and antimony is contained in the wafer.

6. The semiconductor wafer of claim 1, comprising a "denuded zone" and a "bulk zone" with fluorine-containing defects which bind metallic impurities.

7. The semiconductor wafer of claim 1, further comprising an epitaxial layer.

8. A method for producing semiconductor wafers composed of monocrystalline silicon of claim 1, comprising providing a melt comprising silicon which is doped with fluorine, and crystallizing the melt to form a single crystal which contains fluorine within the range of $1\cdot 10^{10}$ to $1\cdot 10^{16}$ atoms/cm$^3$, the crystallizing taking place at a rate at which agglomerated intrinsic point defects having the target diameter or a diameter larger than the target diameter would arise if fluorine as a dopant were dispensed with, and separating semiconductor wafers from the single crystal.

9. The method of claim 8, wherein the melt is doped with fluorine such that the fluorine concentration in the single crystal is $1*10^{11}$ to $1*10^{15}$ atoms/cm$^3$.

10. The method of claim 8, wherein a diameter within the range of 5 to 60 nm is the target diameter.

11. The method of claim 10, wherein a diameter within the range of 5 to 40 nm is regarded as the target diameter.

12. The method of claim 8, wherein the melt is crystallized according to the Czochralski method.

13. The method of claim 8, wherein the melt is crystallized according to the floating zone method.

14. The method of claim 8, wherein a gaseous fluorine source is used for doping the melt with fluorine.

15. The method of claim 14, wherein the gaseous fluorine source is selected from the group consisting of $SiF_4$, HF, $F_2$, $BF_3$, $PF_5$, and mixtures thereof.

16. A method of claim 8, wherein a solid fluorine source is used for doping the melt with fluorine.

17. A method of claim 16, wherein the fluorine source is selected from the group consisting of $NH_4F$, $(NH_4)HF_2$, $(NH_4)_2SiF_6$, $(NH_4)BF_4$, and mixtures thereof.

18. The method of claim 8, wherein the melt is also doped with nitrogen, hydrogen, or with both nitrogen and hydrogen.

19. The method of claim 8, wherein the melt is further doped with at least one electrically active element which is selected from the group consisting of boron, phosphorus, arsenic, antimony and mixtures thereof.

20. The method of claim 8, wherein the semiconductor wafers are subjected to heat treatment at a temperature within the range of 550° C. to 1100° C., to form a "denuded zone," and a "bulk zone" having fluorine-containing defects which bind metallic impurities.

21. The method of claim 8, wherein an epitaxial layer is deposited on the semiconductor wafers.

22. A method for producing semiconductor wafers composed of monocrystalline silicon of claim 1, comprising providing a melt composed of silicon which is doped with a minimum concentration of fluorine or more than said minimum concentration, and crystallizing the melt to form a single crystal which contains fluorine within the range of $1\cdot 10^{10}$ to $1\cdot 10^{16}$ atoms/cm$^3$, the crystallizing taking place at a rate which in the absence of fluorine in the melt, would lead to the formation of agglomerated intrinsic point defects having the target diameter or greater, and separating semiconductor wafers from the single crystal, the minimum concentration of fluorine being determined in a test experiment in which a test crystal is produced from a melt with a varied fluorine concentration under otherwise identical conditions, and a fluorine concentration is identified as the minimum concentration which, when reached, produces agglomerated intrinsic point defects whose diameter is greater than or equal to the target diameter disappear in the test crystal.

* * * * *